United States Patent
Kowalski

(12) 
(10) Patent No.: US 6,247,033 B1
(45) Date of Patent: Jun. 12, 2001

(54) RANDOM SIGNAL GENERATOR

(75) Inventor: Jacek Kowalski, Trets (FR)

(73) Assignee: Inside Technologies, Saint Clement les Places (FR)

( * ) Notice: Subject to any disclaimer, the term of this patent is extended or adjusted under 35 U.S.C. 154(b) by 0 days.

(21) Appl. No.: 09/523,270

(22) Filed: Mar. 10, 2000

Related U.S. Application Data

(63) Continuation of application No. PCT/FR98/01907, filed on Sep. 7, 1998.

(30) Foreign Application Priority Data

Sep. 10, 1997 (FR) .................................................. 97 11210

(51) Int. Cl.[7] .................................................. G06F 1/02
(52) U.S. Cl. .................................................. 708/255
(58) Field of Search .................. 708/250, 251, 708/252, 253, 254, 255, 256; 380/46

(56) References Cited

U.S. PATENT DOCUMENTS

| | | | | |
|---|---|---|---|---|
| 3,612,845 | * | 10/1971 | Lawlor ................................ | 708/101 |
| 4,183,088 | * | 1/1980 | Simmons ............................ | 708/250 |
| 4,513,386 | * | 4/1985 | Glazer ................................ | 708/255 |
| 5,128,998 | * | 7/1992 | Kurihara ............................. | 380/46 |
| 5,627,775 | * | 5/1997 | Hong et al. ........................ | 708/250 |

FOREIGN PATENT DOCUMENTS 2 390 047   12/1978   (FR) .
1157671    5/1985    (SU) .

\* cited by examiner

*Primary Examiner*—Chuong Dinh Ngo
(74) *Attorney, Agent, or Firm*—Akin, Gump, Strauss, Hauer & Feld, L.L.P.

(57) ABSTRACT

The present invention relates to a random signal generator (10) comprising means (11, 12, 13) for converting an electronic noise (N, N1, N2) into a logic signal (RS) whose value depends on the random fluctuations of the electronic noise (N). According to one embodiment, the generator (10) comprises at least two delay lines (11, 12) having initially balanced time constants (T). The two delay lines (11, 12) receive a pulsed reference signal (Hr) at input and at least one of the delay lines (11, 12) receives an electronic noise (N1, N2) causing its time constant (T) to fluctuate ($\Delta t$). The temporal lag between the two pulsed signals (S1, S2) is detected by a circuit (13) delivering a logic signal (RS) whose value is a function of the relative lag between the two pulsed signals (S1, S2). Advantageously, the electronic noise (N1, N2) is a differential noise taken at two points (GND1, GND2) of a ground plane or two points (PV1, PV2) of an electrical supply plane.

10 Claims, 3 Drawing Sheets

RANDOM SIGNAL GENERATOR

CROSS-REFERENCE TO RELATED APPLICATION

This application is a continuation of International Application PCT/FR98/01907 filed Sep. 7, 1998 the disclosure of which is incorporated herein by reference.

BACKGROUND OF THE INVENTION

The present invention relates to a random signal generator.

In electronics, and especially in the field of chip cards, it is sometimes necessary to have available means to generate a random logic signal, namely a signal comprising a random sequence of bits at 1 or at 0.

For example, in a standard procedure of chip card reader authentication, a chip card sends the reader a random signal, hereinafter called RANDOM, of the type referred to here above, comprising for example 16 or 32 bits. The chip card computes the result $R=R_{K_s}$ (RANDOM) of the conversion of RANDOM by an authentication function $F_{K_s}$ using a secret key Ks. The terminal, for its part, performs the same computation and sends a result R' to the card. If the results R and R' are identical, the card considers the terminal to be authentic and agrees to carry out the requested transaction.

In the prior art, certain wired logic random generators take the form of a logic machine (or cell automaton) comprising a finite number of internal states. These may be for example a shift register, some bits of which are sent back to input by means of an XOR gate. On the basis of an initial internal state, the logic machine is activated by means of a clock signal and, at each clock stroke, an internal bit of the logic machine is extracted.

The drawback of these logic machines is that they generally show a high rate of repetitivity of the sequences of bits that they produce, as well as a statistical bias at output relating to the distribution of the "1"s and "0"s. To mitigate this drawback, it is necessary to design logic machines having a very large number of internal states, the theoretical ideal being that the machine should have an infinite number of internal states. However, this approach runs counter to the requirements of simplicity, low cost price and low consumption on the part of the random generators.

Furthermore, there are known random generators using electronic noise as a random signal source. Indeed, electronic noise is by its nature essentially random. Furthermore, electronic noise is present in all electronic circuits because of the thermoelectric agitation, present in electronic components, and the transistor switching noises. It is therefore easy to make an electronic noise source, for example by means of an electronic component or, more simply again, by tapping the electronic noise present inside a circuit.

FIG. 1 gives a schematic view of a standard random generator 1 working by means of an electronic noise source N. The generator 1 comprises an infinite theoretical gain comparator 2 receiving the electronic noise N at its positive input and a reference voltage Vref at its negative input. The output of the comparator 2 delivers a random logic signal RS. The signal RS is applied to a sampler circuit 3 that delivers a random signal RSs synchronized with a clock signal Hs. The circuit 3 is for example an S-C flip-flop circuit activated by the leading edges of the clock signal Hs. The synchronous flip-flop circuit 3 receives the RS signal at its input S (Set) and a reverse signal /RS at its input C (Clear) by means of an inverter gate 4. The signal RSs is taken at the Q output of the flip-flop circuit S-C.

FIG. 2 shows the signals RS, Hs and RSs of the generator 1 and FIG. 3 shows the fluctuations of the noise N in relation to the reference voltage Vref. The signal RS oscillates randomly between the logic value 0 and the logic value 1 (saturation voltage of the amplifier 2) as a function of the amplitude of the noise N in relation to the reference voltage Vref. Since the noise N is essentially random, the signal RS is also random. At each edge 5 of the clock signal Hs, the synchronized signal RSs copies the value of the signal RS and keeps this value up to the next clock edge. The signal RSs is thus a random sequence of bits synchronized with the clock signal Hs, for example the sequence "11010110001" shown in FIG. 2.

Practice shows that the generator 1 of FIG. 1 has various drawbacks, relating firstly to the electrical consumption of the comparator 2 and, secondly, to the difficulty of compensating for the voltage drifts that appear in the amplifier 2 as a function of the temperature. As shown in FIG. 4, these drifts cause the amplifier 2 to shift the noise N with respect to the reference voltage Vref so that the signal RS may be found to be blocked at the value 1 or 0.

The patent application FR 2 390 047 describes a random signal generator in which the amplitude of an electronic noise is compared with a reference voltage to produce a logic signal with a random pulse width. This principle of operation corresponds to the one that has just been described.

BRIEF SUMMARY OF THE INVENTION

Thus, a goal of the present invention is to provide for a means for converting an electronic noise into a random logic signal that has high working stability and low sensitivity to temperature.

A more particular goal of the invention is that this means should have low electrical consumption and be simple to make.

To achieve these goals, the idea of the present invention is to convert an electronic noise into a temporal lag of two pulses signals coming from one and the same reference pulsed signal, and then convert the temporal lag into a logic signal.

The U.S. Pat. No. 4,183,088 describes a random signal generator comprising 14 random generators whose outputs are applied to the 14 inputs of a shift register. The contents of the shift register, namely the random bits, are compared bit by bit with the contents of a reference shift register to produce a random signal. The working of each of the 14 random generators relies on the principle described further above. This working also includes a step for the comparison of pulsed signals but these pulsed signals do not come from the same reference pulsed signal.

Thus, essentially, the present invention provides for a random signal generator arranged to convert an electronic noise into a logic signal whose value depends on the random fluctuations of the electronic noise, comprising means for converting at least one electronic noise into a temporal lag between at least two pulsed signals coming from one and the same reference pulsed signal and means for delivering a logic signal whose value is a function of the relative lag between the two pulsed signals.

According to one embodiment, the means for converting at least one electronic noise comprise at least two delay lines having initially balanced time constants, receiving the pulsed reference signal at input, and means for injecting at least one electronic noise into at least one of the delay lines, so as to cause its time constant to fluctuate.

According to one embodiment, the delay lines comprise cascade-connected logic gates, and at least one logic gate of at least one delay line receives an electronic noise causing its switch-over time constant to fluctuate.

According to one embodiment, the electronic noise is applied to the ground terminal or the supply terminal of the logic gate.

According to one embodiment, the electronic noise is applied to the ground terminal of a buffer capacitor connected to the output of the logic gate.

Advantageously, the electronic noise is a differential noise taken at two points of a ground plane.

Advantageously, the electronic noise is a differential noise taken at two points of an electrical power supply plane.

According to one embodiment, the generator comprises at least two distinct oscillators to deliver two non-correlated oscillating signals, the oscillating signals are injected as complementary noise in the delay lines.

According to one embodiment, the output of one of the delay lines is brought to its input by means of logic gates to form an oscillator delivering the pulsed reference signal.

According to one embodiment, the generator comprises means for sampling the logic signal at the rate of a synchronization signal.

BRIEF DESCRIPTION OF SEVERAL VIEWS OF THE DRAWINGS

These objects, characteristics and advantages as well as others in the present invention shall be explained in greater detail in the following description of various exemplary embodiments of a random generator according to the invention, given on a non-restrictive basis with reference to the appended figures, of which.

DETAILED DESCRIPTION OF THE INVENTION

Figure 1:
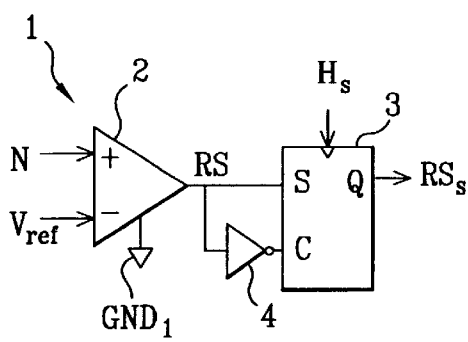
FIG. 1, described here above, is the electronic diagram of a standard random generator, FIG. 2 described here above shows signals present in the generator of FIG. 1, FIGS. 3 and 4 described here above, represent an electronic noise and a reference voltage applied to the generator of FIG. 1, FIG. 5 gives a view, in the form of blocks, of a random generator according to the invention.
Figure 2:
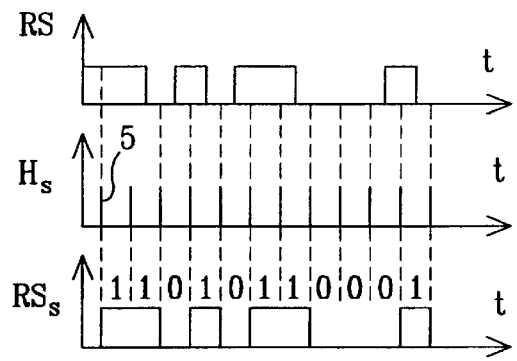
Figure 3:
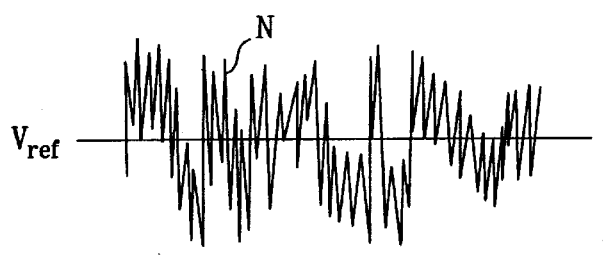
Figure 4:
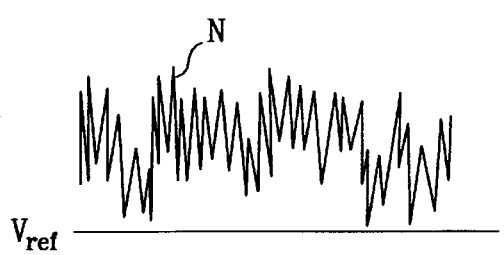
Figure 5:
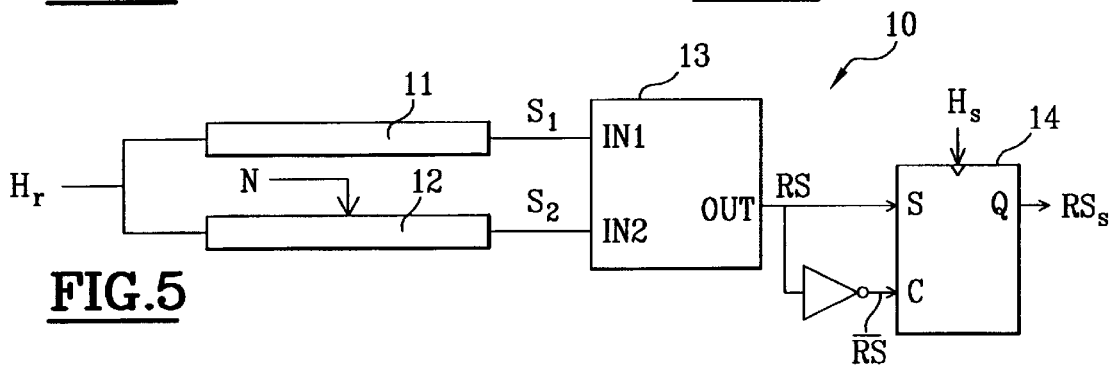
FIG. 5, FIGS. 7 to 10 show exemplary embodiments of delay lines according to the invention, shown in the form of blocks in FIG. 5.

FIG. 5 shows a generator 10 of random signals RS according to the invention. As indicated further above, the idea of the present invention is to convert an electronic noise into a temporal lag between two pulsed signals coming from one and the same reference pulsed signal and then convert the temporal lag into a logic signal.

The generator 10 thus comprises two delay lines 11 and 12 receiving a reference pulsed signal Hr at input and each delivering a signal S1, S2 respectively, having a delay time T on the signal Hr. Initially, the delay lines 11, 12 are balanced and each of them has the same time constant T.

Thus, normally, the signals S1 and S2 are synchronous and copy the signal Hr with one and the same delay T. According to the invention, a noise N is injected into at least one of the delay lines, for example the line 12 so as to modify its time constant by a random value $\Delta t$ that is positive or negative according to the amplitude of the noise N.

The pulsed signals S1, S2, lagged by the injection of the noise N into the line 12, are sent respectively to the inputs IN1, IN2 of a circuit 13. The circuit 13 delivers a logic signal RS at its output OUT. The instantaneous value of this logic signal RS is a function of the direction of lag between the signals S1, S2. Optionally, the random signal RS is then sampled at the rate of a clock signal Hs by an S-C type flip-flop circuit 14 whose Q output delivers a synchronized random signal RSs.

Figure 6:
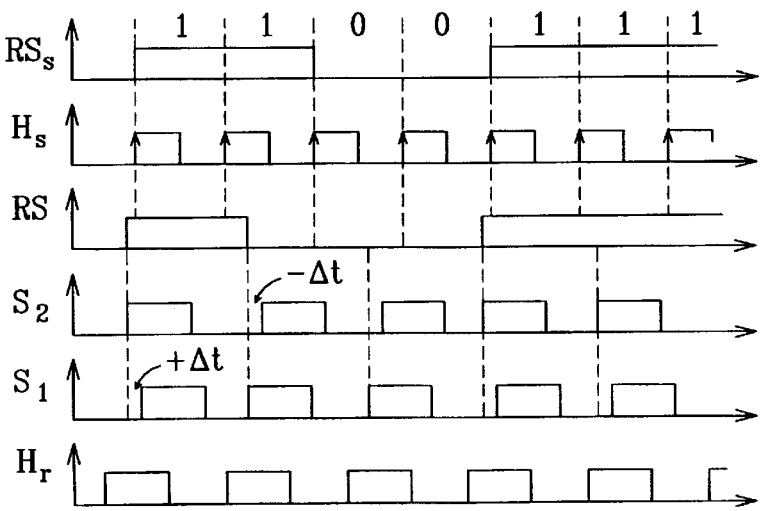
FIG. 6 shows various signals appearing in the generator

The working of the random generator 10 is illustrated by FIG. 6 which shows the signals Hr, S1, S2, RS, Hs and RSs. It can be seen that the signal S2 delivered by the line 12 (subjected to the noise N) is sometimes in advance by $+\Delta t$, sometimes delayed by $-\Delta t$ on the signal S1. The circuit 13 is activated at each reception of a pulse of one of the signals S1 or S2. When a pulse S1 is received before a pulse S2, the circuit 13 puts its output OUT at 1 (signal RS). When a pulse S1 is received before a pulse S2, the circuit 13 places its output at 0. The signal RS is therefore a random signal whose value depends on the direction of lag between the signals S1, S2. The synchronized signal RSs copies the signal RS at each leading edge of the sampling clock circuit Hs.

Figure 7:
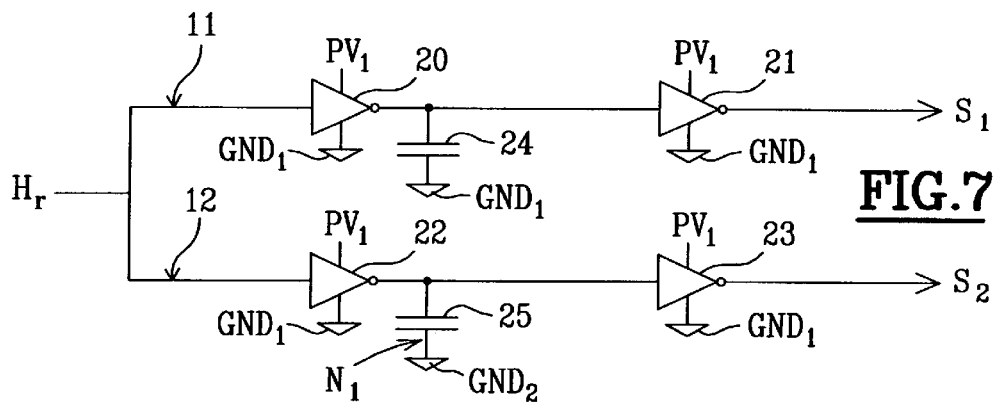
Figure 8:
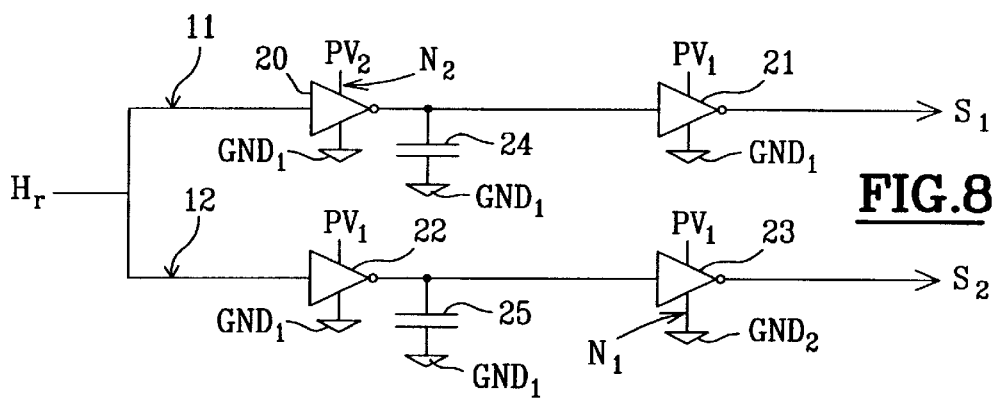
Figure 9:
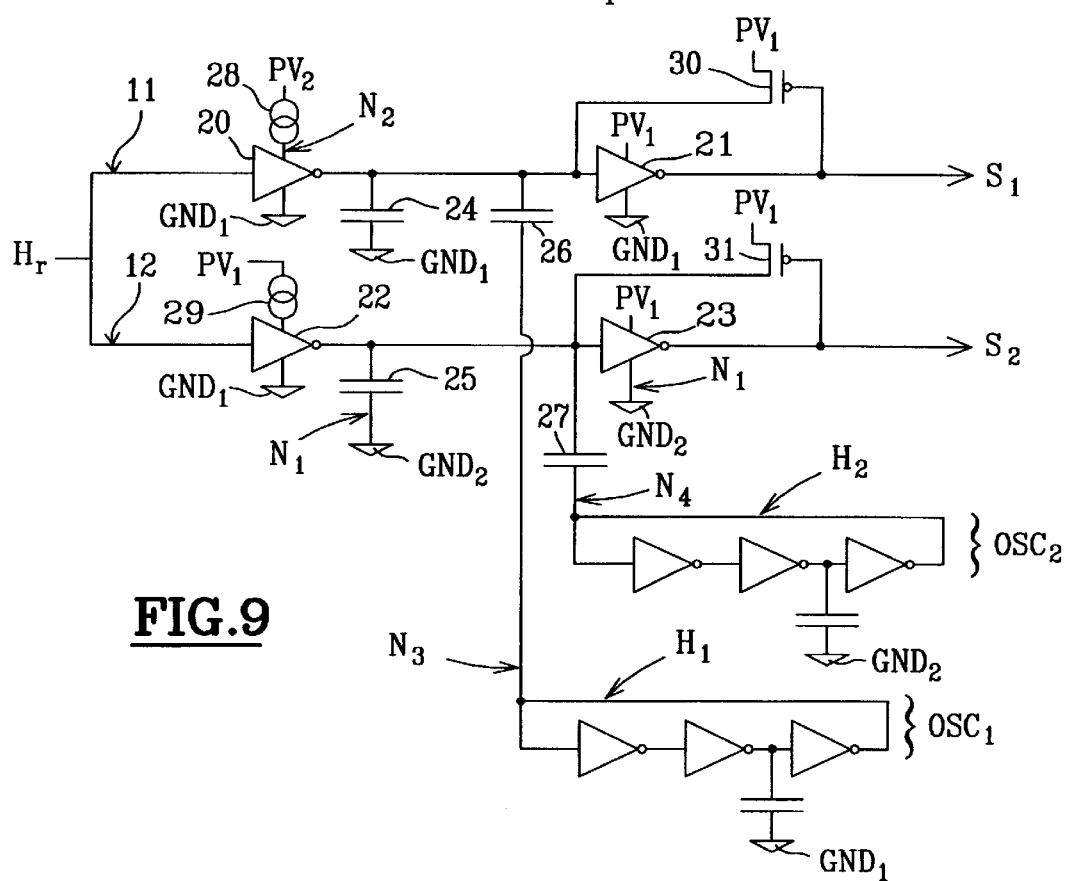

A description shall now be given, with reverence to FIGS. 7 to 9, of a simple example of an embodiment of the delay lines 11, 12 and examples of noise injection in at least one of the delay lines.

In FIG. 7, the lines 11 and 12 each comprise two cascade-connected inverter gates, respectively 20, 21 and 22, 23, and are strictly identical. The gate 20 is strictly identical, within the limits of the manufacturing technology, to the gate 22 and the gate 21 is strictly identical to the gate 23. The output of the gate 20 is connected to a terminal of a buffer capacitor 20 whose other terminal is connected to the ground. This capacitor 24 is added to the parasitic output capacitor of the gate 20 and enables the calibration of the time constant T of the line 11. At the output of the gate 22 of the line 12 there is a buffer capacitor 25 that is strictly identical to the capacitor 24. The gates 20 to 23 are supplied with a voltage Vcc taken at the same point PV1 of an electrical supply plane and are connected to one and the same ground point GND1 of a ground plane. The ground plane of the capacitor 24 is connected to the ground point GND1 while the ground terminal of the capacitor 25 is connected to another ground point GND2, taken at another place of the ground plane.

According to the invention, a differential electronic noise N1 is injected into the ground terminal of the capacitor 25. The noise N1 is herein equal to the difference in voltage between the ground points GND2 and GND1 and prompts a random unbalance of the time constants of the two delay lines 11, 12. The pulsed signals S1, S2 at output of the lines 11, 12 are lagged randomly as shown in FIG. 6.

Another example of noise injection is illustrated in FIG. 8. In this figure, all the elements are connected to the ground point GND1, except for the gate 23 of the line 12 which has its ground terminal connected to the ground point GND2. The differential noise N1 is therefore injected here into the ground of the gate 23 and randomly modifies the low selection switching (passage to 0) threshold voltage VTN23 of this gate. The random modification of the threshold voltage VTN23 is expressed by a random unbalance of the time constant of the line 12. Furthermore, all the logic gates have their supply terminal connected to the point PV1 of the supply plane, except for the gate 20 which has its supply terminal connected to another supply point PV2 taken at another place of the supply plane. A differential noise N2 is therefore injected into the supply of the gate 20 and randomly modifies its high selection switching (passage to 1) threshold voltage VTP20. This leads to an additional temporal unbalance between the lines 11 and 12.

According to the embodiment shown in FIG. 9, the noise injections N1 and N2 which have just been described are combined. Thus, the ground terminals of the gate 23 and of the capacitor 25 receive the noise N1, and the supply terminal of the gate 20 receives the noise N2. Furthermore, a capacitor 26 is added in parallel with the capacitor 24 of the line 11 and a capacitor 27 is added in parallel with a capacitor 25 of the line 12. The capacitors 26 and 27 are identical but receive oscillating signals H1, H2 at their ground terminal delivered by different oscillators OSC1, OSC2 having their own different frequencies. Thus, the signal H1 injects an additional noise N3 into the line 11 and the signal H2 injects an additional noise N4 into the line 12. The resulting differential noise is a non-random cyclical noise which however has a very lengthy cycle time (a multiple of the inherent frequencies of the two oscillators OSC1, OSC2).

In practice, the delay lines according to the invention may be the object of various other alternative embodiments and improvements. In particular, although, with a view to the simplicity of the description, the delay lines 11, 12 represented in FIGS. 7 to 9 have only two cascade-connected inverter gates, it is clear that this number may be increased and chosen as a function of the time constant to be obtained and the switching-over characteristics of the logic gate. Furthermore, various noise injection points may be planned.

Furthermore, it must be noted that the making of the delay line 11, 12 by means of logic gates, especially CMOS gates, makes it possible to control the consumption of the generator 10 according to the invention. For example, the gates 20 and 22 whose outputs drive the capacitors 24, 26 and 25, 27 may be supplied by means of current generators 28, 29 with low throughput rates, as shown in FIG. 9 (it is also possible to set the size of the drain of the PMOS transistor that it comprises so as to limit the selection switching current). Also, given that the CMOS gates do not consume current except during the switch-over, PMOS transistors 30, 31 mounted as selection switch accelerators may be planned between the outputs of the gates 21 and 23 and their inputs, as illustrated in FIG. 9.

Figure 10:
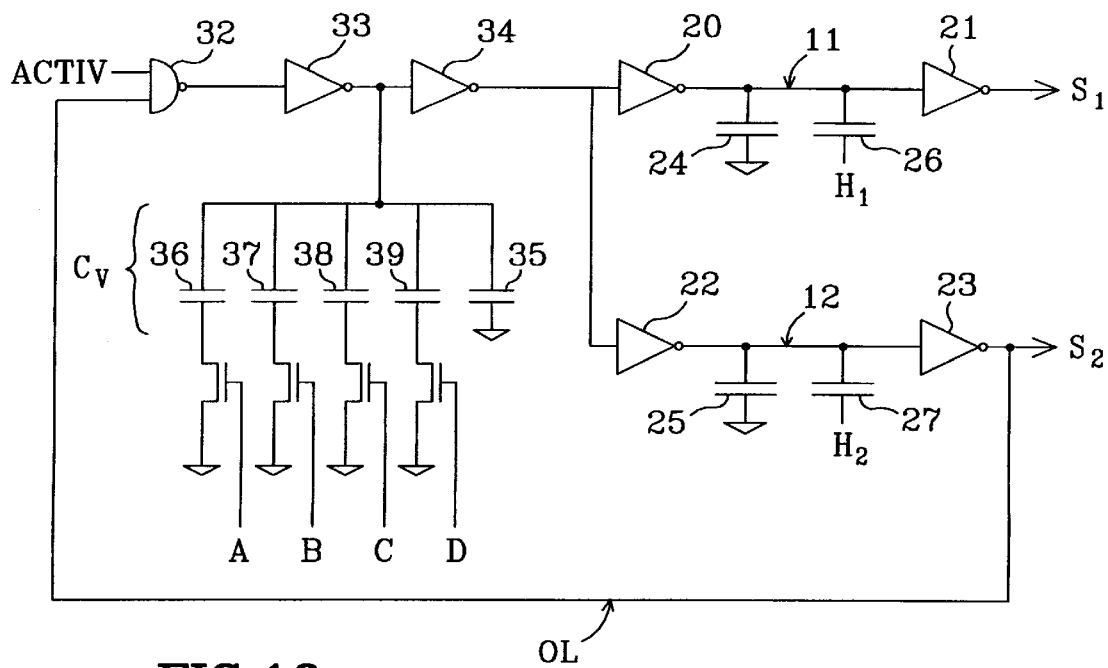
Figure 11:
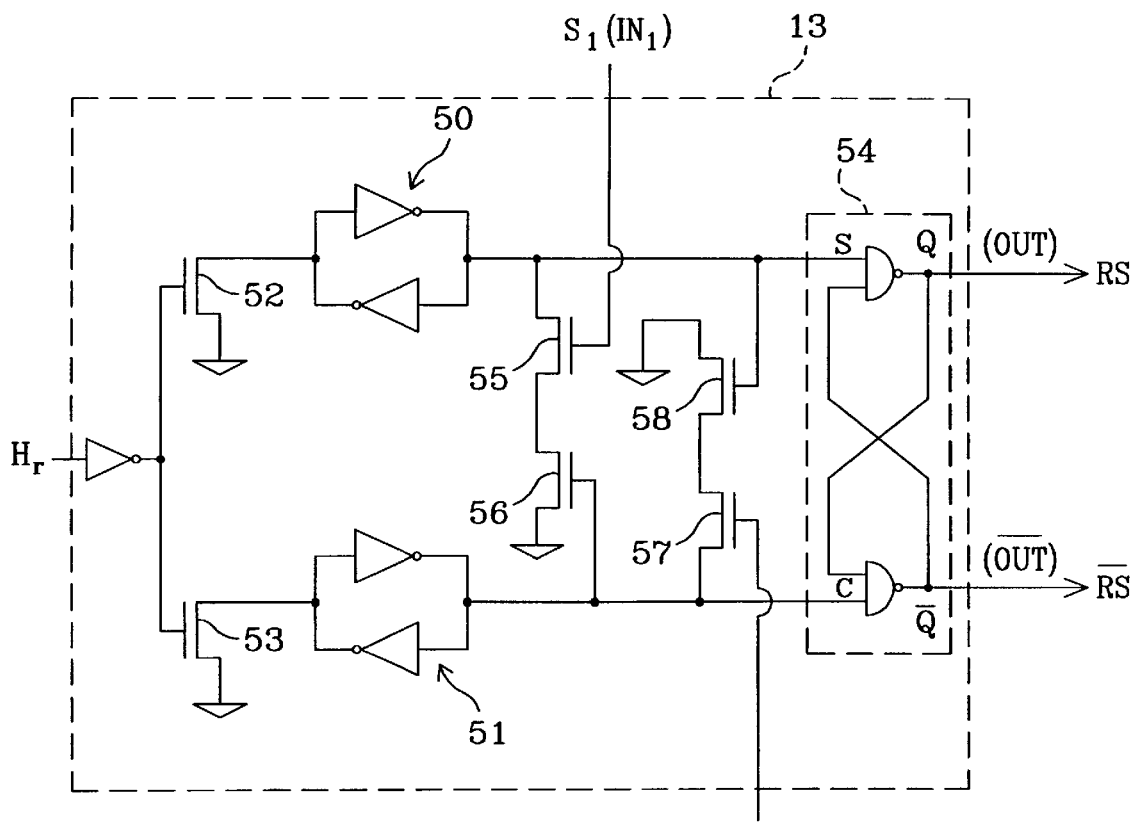
FIG. 11 is the electrical diagram of an element of the generator of FIG. 5.

Finally, according to an advantageous embodiment shown in FIG. 10, one of the delay lines, in this case the line 12, has its output brought to its input by means of inverter gates 32, 33, 34 in cascade. The assembly forms an oscillator loop OL enabling the generation, on site, of the reference signal Hr applied to the input of the lines 11, 12. In FIG. 10, the output of the line 12 is brought to the input by means of a NAND gate 32 driven by an activation signal ACTIV of the generator and two inverter gates 33, 34. The total number of inverter gates of the oscillator loop OL must be conventionally an odd number.

Furthermore, the output of an inverter gate of the loop OL, for example the gate 33, comprises a variable buffer capacitor Cv at its output. The capacitor Cv comprises the following in parallel: a capacitor 35 and switching capacitors 36 to 39 that can be switched over by means of MOS transistors driven by signals A, B, C, D. These signals may be picked up at any point of the integrated circuit, for example in an address or data bus or at the output of the generator 10. The modification of the capacitor Cv leads to a modification of the resonance frequency of the oscillator loop OL.

FIG. 9 shows an embodiment of the circuit 13 of FIG. 5. The circuit 13 has two memory inverters 50, 51 whose inputs are connected to the ground by means of two transistors 52, 53 respectively. The reference signal Hr controls the transistors 52, 53 by means of an inverter gate. The outputs of the inverters 50, 51 respectively drive the input S and the input C of an S-C type flip-flop circuit 54. The Q output of the flip-flop circuit 54 delivers the RS signal and the output /Q delivers the reverse signal /RS. The output of the inverter 50 is connected to the ground by means of two series-connected transistors 55, 56. The transistor 55 is driven by the signal S1 and the transistor 56 is driven by the output of the inverter 51. Symmetrically, the output of the inverter 51 is connected to the ground by means of two transistors 57, 58. The transistor 57 is driven by the signal S2 and the transistor 58 is driven by the output of the inverter 50.

The output signal RS goes to 1 when the output of the inverter 50 goes to 0, and it goes to 0 when the output of the inverter 51 goes to 0. At each period of the reference signal Hr, the output of the inverters 50, 51 is set at 1 by the passage to 0 of the signal Hr which precedes the pulses of the signals S1, S2. During the waiting period that follows, the flip-flop circuit 54 thus holds the current value of the signal RS at the output of the circuit 13. If, thereafter, a pulse S1 appears before a pulse S2, the pulse S1 shuts the transistor 55, the output of the inverter 50 goes to 0, and the signal RS goes to 1 (or remains at 1, depending on its previous value). Conversely, if a pulse S2 appears before a pulse S1, the pulse S2 shuts the transistor 57, the output of the inverter 51 goes to 0 and the signal RS goes to 0 (or remains at 0). It can be seen that the structure of the circuit is such that the outputs of the memory inverters 50, 51 cannot be simultaneously at 0, one of the transistors 56, 58 being made non-conductive by the first inverter whose output is at 0. The three possible states of the outputs of the inverters 50, 51 are therefore:

"11": reception of a pulse at 0 of the signal Hr (initialization phase),

"01": reception of a pulse S1 before a pulse S2, or

"10": reception of a pulse S2 before a pulse S1, and correspond respectively to the holding of the previous value of the signal RS, the passage to 1 (or holding at 1) of the signal RS, the passage to 0 (or holding at 0) of the signal RS.

It will clearly be seen by those skilled in the art that the present invention is open to numerous alternative embodiments and improvements. In particular, in practice there are various methods for obtaining delay lines that are perfectly symmetrical in the absence of electronic noise. These methods relate to the know-how of those skilled in the art and have not been described with a view to simplicity. Furthermore, it can be noted that the providing of several pairs of delay lines in parallel, each having their own oscillator loops or a common oscillator loop, enables the delivery, in one clock stroke, of a random word comprising a plurality of parallel bits. Furthermore, although all the delay lines according to the invention have been presented as being constituted by logic gates, it is clear that these delay lines can be made in various other known ways. Finally, it must be noted that the random generator according to the invention, owing to its simplicity and its low current consumption, is perfectly suited to the integrated circuits of chip cards, especially the integrated circuits of contactless chip cards powered by electromagnetic induction and having low energy resources.

What is claimed is:

1. Random signal generator (1, 10) arranged to convert an electronic noise (N, N1, N2) into a logic signal (RS) whose value depends on the random fluctuations of the electronic noise (N, N1, N2), characterized in that it comprises:

means (10, 11) for converting at least one electronic noise (N, N1, N2) into a temporal lag between at least two pulsed signals (S1, S2) coming from one and the same reference pulsed signal (Hr), and means (13) for delivering a logic signal (RS) whose value is a function of the relative lag (+Δt, −Δt) between the two pulsed signals (S1, S2).

2. Generator (1, 10) according to claim 1, wherein the means for converting at least one electronic noise comprise:

at least two delay lines (11, 12) having initially balanced time constants (T), receiving said pulsed reference signal (Hr) at input, means (20, 22, 23, 25) got injecting at least one electronic noise (N, N1, N2) into at least one of the delay lines (11, 12), so as to cause its time constant (T) to fluctuate (+Δt, −Δt).

3. Generator according to claim 2, characterized in that it comprises at least two distinct oscillators (OS1, OS2) to deliver two non-correlated oscillating signals (H1, H2), and in that the oscillating signals are injected as complementary noise (N3, N4) in the delay lines.

4. Generator according to claim 2, wherein the output of one of the delay lines is brought to its input by means of logic gates (32, 33, 34) to form an oscillator delivering said pulsed reference signal (Hr).

5. Generator according to claim 2, wherein:

the delay lines (11, 12) comprise cascade-connected logic gates (20–23), and at least one logic gate (20, 22, 23) of at least one delay line (11, 12) receives an electronic noise (N1, N2) causing its switching time constant to fluctuate.

6. Generator according to claim 5, wherein the electronic noise (N1, N2) is applied to the ground terminal or the supply terminal of the logic gate (20, 23).

7. Generator according to one claim 5, wherein the electronic noise (N1) is applied to the ground terminal of a buffer capacitor (25) connected to the output of the logic gate (22).

8. Generator according to claim 1, characterized in that the electronic noise (N1, N2) is a differential noise taken at two points (GND1, GND2) of a ground plane.

9. Generator according to claim 1, characterized in that the electronic noise (N1, N2) is a differential noise taken at two points (PV1, PV2) of an electrical supply plane.

10. Generator (1, 10) according to claim 1, comprising means for sampling the logic signal (RS) at the rate of a synchronization signal (Hs).

* * * * *